United States Patent
Kwon

(10) Patent No.: US 9,621,165 B2
(45) Date of Patent: Apr. 11, 2017

(54) TRANSMITTING/RECEIVING SYSTEM

(71) Applicant: SK hynix Inc., Gyeonggi-do (KR)

(72) Inventor: Kyoung-Han Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 14/939,126

(22) Filed: Nov. 12, 2015

(65) Prior Publication Data
US 2016/0329887 A1 Nov. 10, 2016

(30) Foreign Application Priority Data

May 6, 2015 (KR) ........................ 10-2015-0062932

(51) Int. Cl.
*H03K 19/0175* (2006.01)
*H03K 19/0185* (2006.01)

(52) U.S. Cl.
CPC ................. *H03K 19/0185* (2013.01)

(58) Field of Classification Search
CPC ................................................ H03K 19/0185
See application file for complete search history.

(56) References Cited

U.S. PATENT DOCUMENTS

| 5,977,796 A | 11/1999 | Gabara |
| 7,795,931 B2 * | 9/2010 | Kobayashi ............. H03K 5/082 327/112 |
| 2005/0030817 A1 | 2/2005 | Luk et al. |

\* cited by examiner

*Primary Examiner* — Hai L Nguyen
(74) *Attorney, Agent, or Firm* — IP & T Group LLP

(57) ABSTRACT

A transmitting/receiving system may include a transmitting circuit and a receiving circuit. The transmitting circuit may include: a pull-up element suitable for pull-up driving a first node in response to a signal; a pull-down element suitable for pull-down driving a second node in response to the signal; and a voltage tailor coupled between the first and second nodes, and transmitting a low-swing signal obtained by reducing the swing amplitude of the signal to a transmission line, and the receiving circuit may include: a reference voltage generator having a replica circuit of the receiving circuit and suitable for generating a reference voltage; and a differential amplifier suitable for differentially amplifying the reference voltage and the low-swing signal received through the transmission line.

14 Claims, 6 Drawing Sheets

TRANSMITTING/RECEIVING SYSTEM

CROSS-REFERENCE TO RELATED APPLICATIONS

The present application claims priority of Korean Patent Application No. 10-2015-0062932, filed on May 6, 2015, which is incorporated herein by reference in its entirety.

BACKGROUND

1. Field

Various embodiments of the present invention relate to a technology for transmitting and receiving a signal.

2. Description of the Related Art

In general, integrated circuit chips operate while exchanging signals (e.g., data) with peripheral chips. For example, a memory chip such as a DRAM or a flash memory exchanges data with a memory controller, and a central processing unit (CPU) also exchanges data with various chips on a board. Furthermore, signal transmission is not only performed between chips, but it is also performed between internal circuits within an integrated circuit chip.

While signals are transmitted/received, electric current is consumed. The current consumption increases in proportion to the number of transmission lines and the operation frequency. As the data processing ability of an integrated circuit increases, the integrated circuit must transmit/receive more data. Thus, the number of transmission lines and the operation frequency inevitably increase. Therefore, current consumption during signal transmission needs to be reduced.

FIG. 1 illustrates a conventional transmitting/receiving system.

Referring to FIG. 1, the transmitting/receiving system includes a transmitting circuit 110 and a receiving circuit 120.

The transmitting circuit 110 receives an input signal INPUT which swings from a ground voltage VSS (i.e., 0 V) to a power supply voltage VDD, and drives a transmission line 101 with the received signal. The signal swings on the transmission line 101 from the ground voltage VSS to the power supply voltage VDD like the input signal INPUT.

The receiving circuit 120 receives the signal from the transmission line 101 and outputs an output signal OUTPUT which swings from the ground voltage VSS to the power supply voltage VDD.

While a signal is transmitted/received, most of the power is consumed in charging/discharging the transmission line 101. The power consumption at the transmission line 101 may be expressed as the following equation:

$$P=G*f*(\text{signal swing amplitude})^2.$$

In the above equation, 'P' represents power consumption, 'C' represents capacitance of the transmission line 101, and 'f' represents the frequency of a signal transmitted to the transmission line 101.

One method for reducing power consumption during signal transmission is to reduce the swing amplitude of the signals transmitted/received on the transmission line 101. When the swing amplitude of the signal is reduced by ½, the power consumption is reduced to ¼. Thus, such methods exhibit a strong effect on power consumption. However, to reduce the swing amplitude of a signal, a voltage lower other than the power supply voltage VDD must be used, requiring a level shift circuit with a large circuit area. Furthermore, the occurrence of errors may increase due to noise caused in the reduced signal swing amplitude.

SUMMARY

Various embodiments are directed to a transmitting/receiving system which is resistant to noise and PVT (process, voltage and temperature) variations while lowering power consumption by reducing the swing amplitude of a signal, and using a small circuit area.

In an embodiment, a transmitting/receiving system may include a transmitting circuit and a receiving circuit. The transmitting circuit may include: a pull-up element suitable for pull-up driving a first node in response to a signal; a pull-down element suitable for pull-down driving a second node in response to the signal; and a voltage tailor coupled between the first and second nodes, and transmitting a low-swing signal obtained by reducing the swing amplitude of the signal to a transmission line, and the receiving circuit may include: a reference voltage generator having a replica circuit of the receiving circuit and suitable for generating a reference voltage; and a differential amplifier suitable for differentially amplifying the reference voltage and the low-swing signal received through the transmission line.

The reference voltage generator may include: a replica pull-up element suitable for pull-up driving a third node; a replica pull-down element suitable for pull-down driving a fourth node; and a replica voltage tailor coupled between the third node and the fourth node.

The replica pull-up element and the replica pull-down element may be turned on when the receiving circuit is enabled.

Each of the voltage tailor and the replica voltage tailor may include a resistor and one or more diodes which are coupled in series.

The receiving circuit may further include a latch suitable for latching amplification results of the differential amplifier.

In an embodiment, a transmitting/receiving system may include a transmitting circuit and a receiving circuit. The transmitting circuit may include: a PMOS transistor suitable for pull-up driving a first node in response to a signal; an NMOS transistor suitable for pull-down driving a second node in response to the signal; and one or more resistors and one or more diodes which are coupled in series between the first and second nodes, and transmit a low-swing signal obtained by reducing the swing amplitude of the signal to a transmission line through the first node, and the receiving circuit may include a reference voltage generator having a replica circuit of the transmitting circuit, and suitable for generating a reference voltage; and a differential amplifier suitable for differentially amplifying the reference voltage and the low-swing signal received through the transmission line.

The reference voltage generator may include: a replica PMOS transistor suitable for maintaining a turn-on state when the receiving circuit is enabled, and pull-up driving a third node; a replica NMOS transistor suitable for maintaining a turn-on state when the receiving circuit is enabled, and pull-down driving a fourth node; and one or more replica resistors and one or more replica diodes which are coupled in series between the third and fourth nodes, and the reference voltage may be generated from one node among the third node and nodes between the one or more replica resistors and the one or more replica diodes.

In an embodiment, a transmitting/receiving system may include: a transmission line; a transmitting circuit suitable for transmitting a transmission signal to have a reduced swing amplitude to the transmission line; and a receiving circuit suitable for receiving the transmission signal from the transmission line. The receiving circuit includes: a reference voltage generator having a replica circuit of the transmitting circuit to generate a reference voltage; and a differential amplifier suitable for differentially amplifying the reference voltage and the transmission signal having the reduced swing amplitude, received through the transmission line.

DETAILED DESCRIPTION

Figure 1:
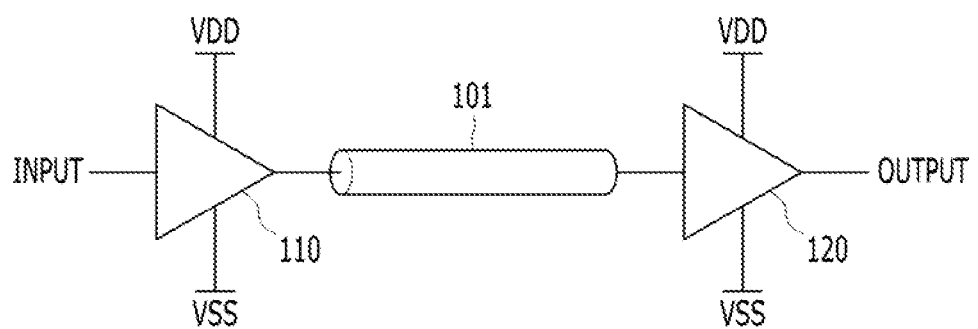
FIG. 1 is a diagram illustrating a conventional transmitting/receiving system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
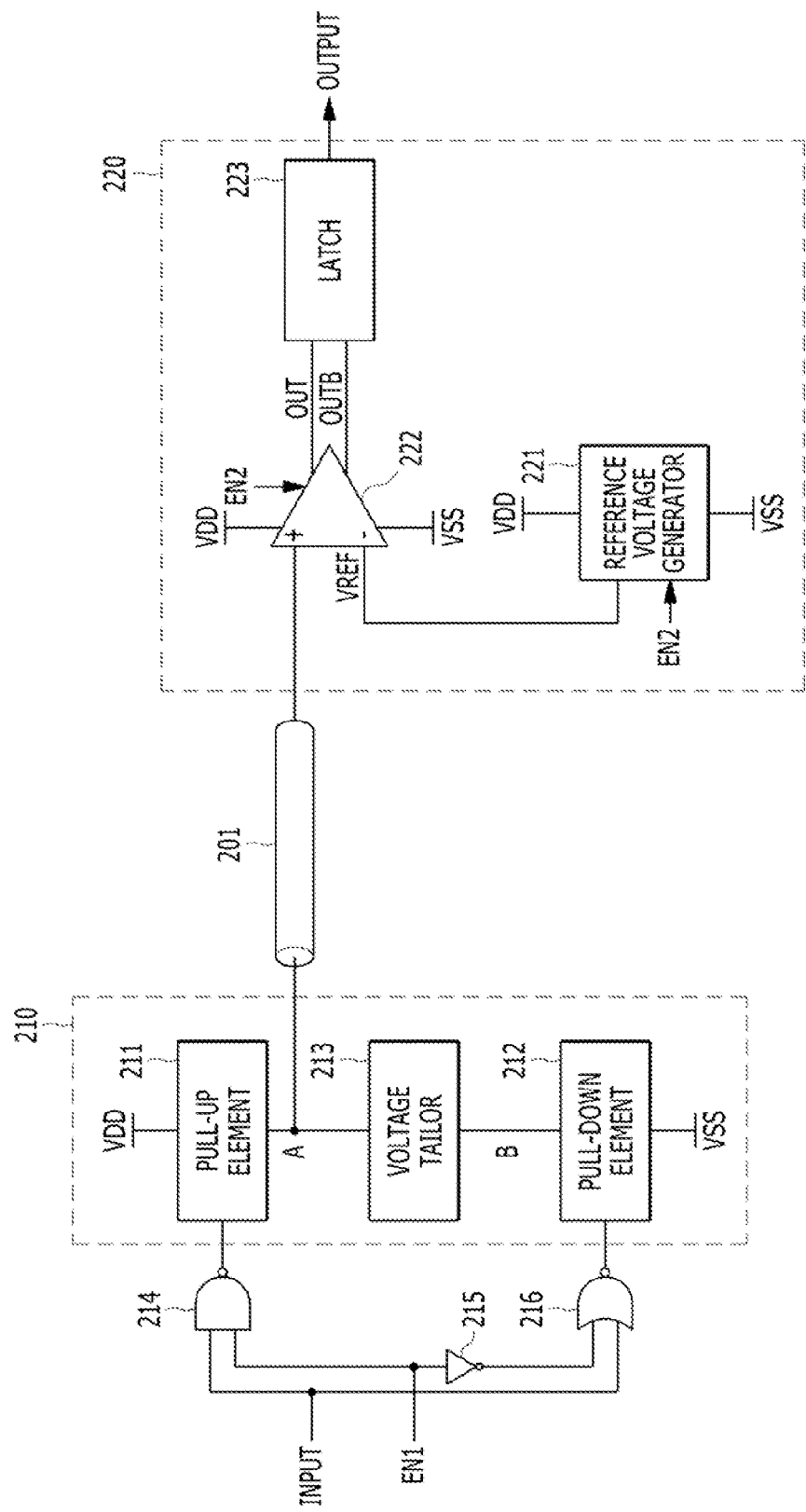
FIG. 2 is a diagram illustrating a transmitting/receiving system in accordance with an embodiment of the present invention.

FIG. 2 is a diagram illustrating a transmitting/receiving system in accordance with an embodiment of the present invention.

Referring to FIG. 2, the transmitting/receiving system may include a transmitting circuit 210, a transmission line 201 and a receiving circuit 220. The transmitting circuit 210 and the receiving circuit 220 of the transmitting/receiving system may be provided in the same integrated circuit chip, or provided in separate integrated circuit chips. That is, the transmitting/receiving system may be used for signal transmission within a chip, and also used for signal transmission between chips.

The transmitting circuit 210 may include a pull-up element 211 a pull-down element 212, and a voltage tailor 213. The pull-up element 211 may pull-up drive a first node 'A' in response to a signal INPUT to be transmitted by the transmitting circuit 210. The pull-down element 212 may pull-down drive a second node B in response to the signal INPUT. The voltage tailor 213 may be coupled between the first and second nodes A and B. The pull-up element 211 and the pull-down element 212 may drive the transmission line 201 to a logic high or logic low level in response to the signal INPUT, and the voltage tailor 213 may reduce the swing amplitude of the signal transmitted to the transmission line 201.

The transmitting/receiving system may further include a NAND gate 214, an inverter 215, and a NOR gate 216 that are used to enable/disable the transmitting circuit 210 in response to an enable signal EN1 of the transmitting circuit 210. When the enable signal EN1 is activated to a high level, the transmitting circuit 210 may drive the signal INPUT to the transmission line 201. On the other hand, when the enable signal EN1 is deactivated to a logic low level, the transmitting circuit 210 may be disabled.

The receiving circuit 220 may include a reference voltage generator 221 a differential amplifier 222, and a latch 223. The reference voltage generator 221 may generate a reference voltage VREF. The reference voltage generator 221 may include a replica circuit of the transmitting circuit 210. The differential amplifier 222 may differentially amplify the reference voltage VREF and a signal transmitted through the transmission line 201. The latch 223 may latch the amplification results OUT and OUTB of the differential amplifier 222. The receiving circuit 220 may be operated when an enable signal EN2 is activated.

The reference voltage generator 221 may include components obtained by replicating the pull-up element 211, the pull-down element 212, and the voltage tailor 213 included in the transmitting circuit 210, and generate the reference voltage VREF using the components. The reference voltage VREF may have a level between the logic high level and the logic low level of the signal which is driven to the transmission line 201 by the transmitting circuit 210. Since the reference voltage generator 221 has the configuration obtained by replicating the transmitting circuit 210, the reference voltage generator 221 may generate the reference voltage VREF having a level between the logic high level and the logic low level of the signal which is driven to the transmission line 201 by the transmitting circuit 210. Although the transmitting circuit 210 is influenced by PVT (Process, Voltage and Temperature) variations, the reference voltage generator 221 may handle a situation change caused by PVT variations, because the reference voltage generator 221 is also influenced by the PVT variations.

The differential amplifier 222 may differentially amplify the reference voltage VREF and the signal transmitted through the transmission line 201. The signals OUT and OUTB amplified by the differential amplifier 222 may have a swing amplitude greater than that of the signal transmitted through the transmission line, and have the same swing amplitude as the signal INPUT inputted to the transmitting circuit 210. That is, the swing amplitude of the signal received by the receiving circuit 220 may be increased by the differential amplifier 222. Since the differential amplifier 222 is operated in a differential manner, the differential amplifier 222 may be resistant to noise and precisely amplify signals.

The latch 223 may latch the signals OUT and OUTB amplified by the differential amplifier 222, and output an output signal OUTPUT. The latch 223 may secure stable operation of the receiving circuit 220, and the swing amplitude of the signal transmitted through the transmission line 201 may be recovered by the differential amplifier 222. Thus, the latch 223 may be omitted from the receiving circuit 220.

Figure 3:
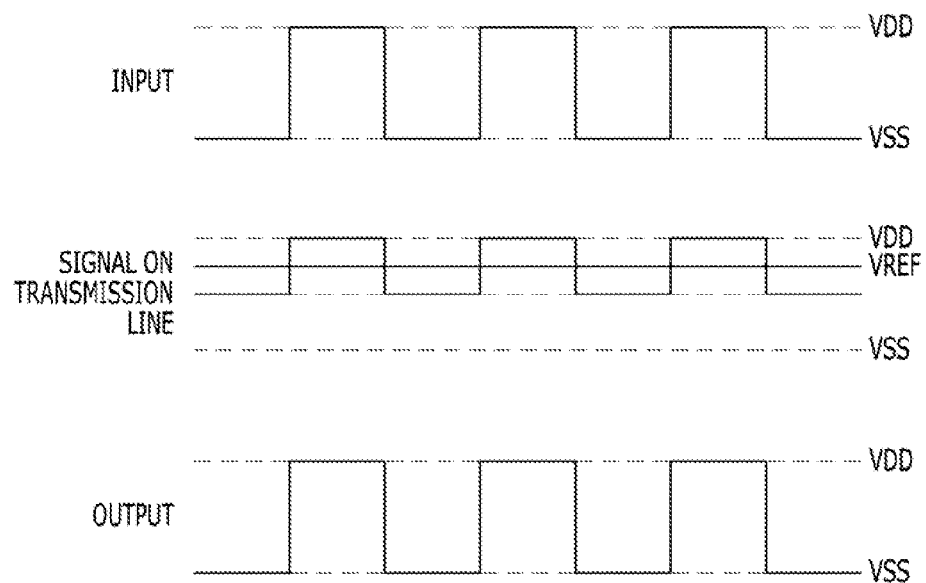
FIG. 3 is a timing diagram for describing an operation of the transmitting/receiving system shown in FIG. 2.

FIG. 3 is a timing diagram for describing an operation of the transmitting/receiving system shown in FIG. 2. In FIG. 3, it is assumed that the enable signal EN1 of the transmitting circuit 210 and the enable signal EN2 are activated, and the signal INPUT continuously toggles.

The signal INPUT inputted to the transmitting circuit 210 may full swing from the ground voltage VSS to the power supply voltage VDD.

Since the transmitting circuit 210 reduces the swing amplitude of the signal INPUT and transmits the signal INPUT to the transmission line 201, the signal on the transmission line 201 may have a swing amplitude less than that of the signal INPUT. FIG. 3 indicates that a logic low level of the signal on the transmission One 201 is higher than the ground voltage VSS, that is, the signals on the transmission line 201 have a limited-swing amplitude.

The reference voltage generator 221 of the receiving circuit 220 may generate a reference voltage VREF that is lower than the logic high level of the signal on the transmission line 201 and higher than the logic low level of the signal on the transmission line 201. Referring to FIG. 3, the reference voltage VREF may have an intermediate level between the logic high level and the logic low level of the signal on the transmission line 201.

The differential amplifier 222 may generate signals OUT and OUTB by differentially amplifying the reference voltage VREF and the signal transmitted through the transmission line 201. The signals OUT and OUTB may full swing from the ground voltage VSS to the power supply voltage VDD.

Figure 4:
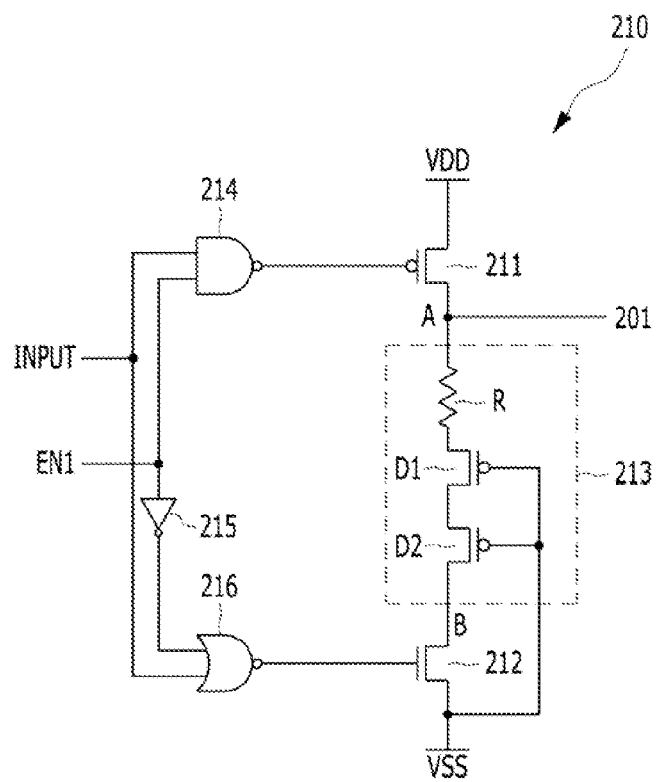
FIG. 4 is a detailed diagram of a transmitting circuit illustrated in FIG. 2.

FIG. 4 is a detailed diagram of the transmitting circuit 210 illustrated in FIG. 2.

Referring to FIG. 4, the transmitting circuit 210 may include the pull-up element 211, the pull-down element 212, and the voltage tailor 213.

The pull-up element 211 may include a PMOS transistor. When an enable signal EN1 of the transmitting circuit 210 is deactivated to a logic low level, the pull-up element 211 may maintain an off state. When the enable signal EN1 of the transmitting circuit 210 is activated to a logic high level, the pull-up element 211 may be turned on to pull-up drive the first node A when the signal INPUT has a logic high level, and turned off when the signal INPUT has a logic low level.

The pull-down element 212 may include an NMOS transistor. When the enable signal EN1 of the transmitting circuit 210 is deactivated to a logic low level, the pull-down element 212 may maintain an off state. When the enable signal EN1 of the transmitting circuit 210 is activated to a logic high level, the pull-down element 212 may be turned on to pull-down drive the second node B when the signal INPUT has a logic low level, and turned off when the signal INPUT has a logic high level.

The voltage tailor 213 may include one or more resistors and one or more diodes which are coupled in series between first and second nodes A and B. FIG. 4 illustrates that the voltage tailor 213 includes one resistor R and two diodes D1 and D2. However, the numbers of resistors and diodes may differ from the configuration of FIG. 4. The resistor R and the diodes D1 and D2 may prevent the voltage of the first node A from falling to the ground voltage VSS, thereby reducing the swing amplitude of the signal on the transmission line 201 coupled to the first node A. As illustrated in FIG. 4, the diodes D1 and D2 of the voltage tailor 213 may be implemented with PMOS transistors.

Figure 5:
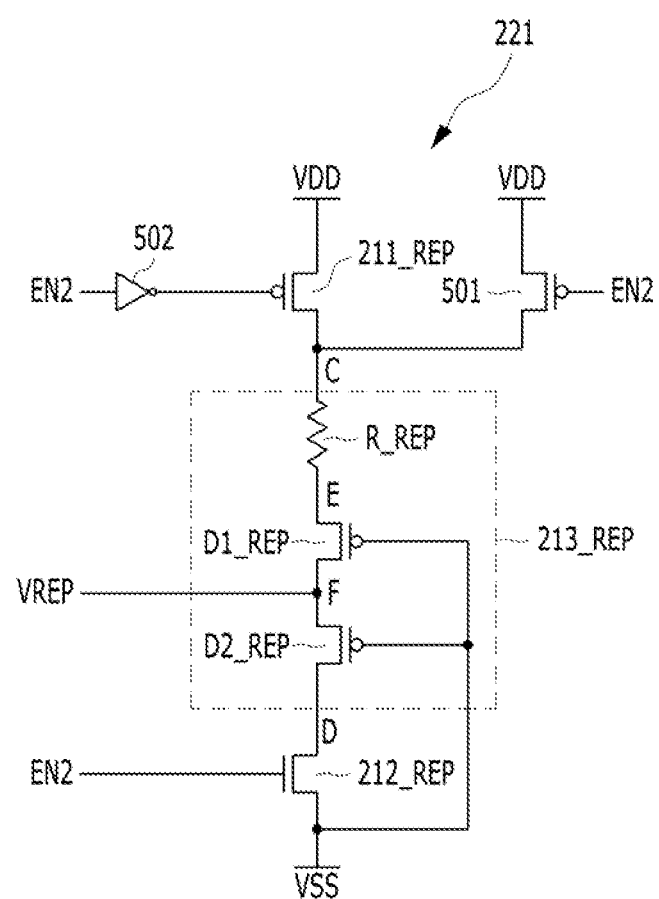
FIG. 5 is a detailed diagram of a reference voltage generator illustrated in FIG. 2.

FIG. 5 is a detailed diagram of the reference voltage generator 221 illustrated in FIG. 2.

Referring to FIG. 5, the reference voltage generator 221 may include a replica pull-up element 211_REP, a replica pull-down element 212_REP, a replica voltage tailor 213_REP, and a precharge pull-up element 501.

The replica pull-up element 211_REP may have a replica circuit of the pull-up element 211, and include a PMOS transistor like the pull-up element 211. When the enable signal EN2 is activated to a logic high level, that is, when a signal inverted by an inverter 502 is in a logic low level, the replica pull-up element 211_REP may be turned on to pull-up drive a third node C.

The replica pull-down element 212_REP may have a replica circuit of the pull-down element 212, and include an NMOS transistor like the pull-down element 212. When the enable signal EN2 is activated to a logic high level, the replica pull-down element 212_REP may be turned on to pull-down drive a fourth node D.

The replica voltage tailor 213_REP may have a replica circuit of the voltage tailor 213, and include one or more replica resistors R_REP and one or more replica diodes D1_REP and D2_REP which are coupled in series between the third and fourth nodes C and D. FIG. 5 illustrates that the voltage tailor 213 includes one resistor R and two diodes D1 and D2. Therefore, FIG. 5 also illustrates that the replica voltage tailor 213_REP includes one replica resistor R_REP and two replica diodes D1_REP and D2_REP. When the number of resistors and diodes included in the voltage tailor 213 are changed, the number of resistors and diodes included in the replica voltage tailor 213_REP may also be changed.

The precharge pull-up element 501 may precharge the third node C when the enable signal EN2 is deactivated. As the precharge pull-up element 501 precharges the third node C to a predetermined level when the enable signal EN2 is deactivated, the reference voltage generator 221 may be rapidly operated after the enable signal EN2 is activated. Since the precharge pull-up element 501 is not directly involved in generating the reference voltage VREF, the precharge pull-up element 501 may be omitted.

When the enable signal EN1 is activated, the replica pull-up element 211_REP and the replica pull-down element 212_REP of the reference voltage generator 221 may be turned on at the same time. Thus, the reference voltage generator 221 may replicate an intermediate state between a state in which the transmitting circuit 210 transmits a high-level signal and a state in which the transmitting circuit 210 transmits a low-level signal. That is, the reference voltage generator 221 may generate the reference voltage VREF having an intermediate value between the high-level signal and the low-level signal. The reference voltage VREF may be outputted from one node among the third node C and nodes E and F within the replica voltage tailor 213_REP. FIG. 5 illustrates that the voltage of the node F is used as the reference voltage VREF.

Figure 6:
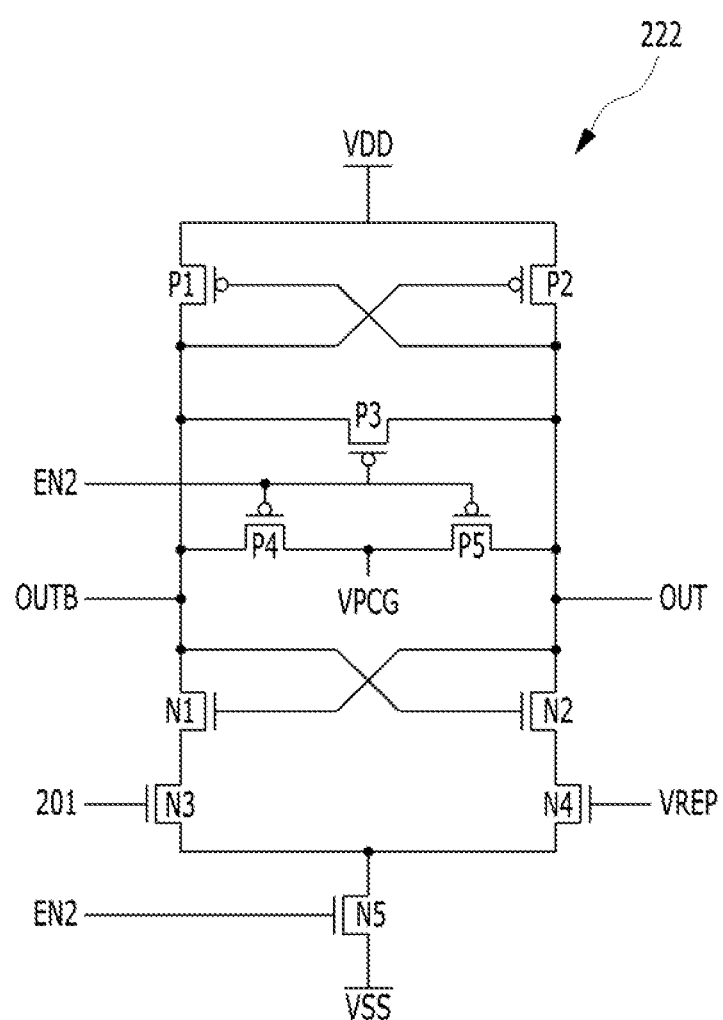
FIG. 6 is a detailed diagram of a differential amplifier illustrated in FIG. 2.

FIG. 6 is a detailed diagram of he differential amplifier 222 illustrated in FIG. 2.

Referring to FIG. 6, the differential amplifier 222 may include PMOS transistors P1 to P5 and NMOS transistors N1 to N5.

When the enable signal EN2 is deactivated to a logic low level, the NMOS transistor N5 may be turned off to disable the amplification operation of the differential amplifier 222. Then, the PMOS transistors P3 to P5 may be turned on to precharge the output signals OUT and OUTB of the differential amplifier 222 to a precharge voltage VPCG. The precharge voltage VPCG may have an intermediate level between the ground voltage VSS and the power supply voltage VDD.

When the enable signal EN2 is activated to a logic high level, the NMOS transistor N5 may be turned on to form a current path of the differential amplifier 222, the differential amplifier 222 may be enabled, and the PMOS transistors P3 to P5 may be turned off to stop the precharge operation. Then, an amplification operation through the PMOS transistors P1 and P2 and the NMOS transistors N1 to N4 may start. When the signal of the transmission line 201 has a higher voltage than the reference voltage VREF, the differential amplifier 222 may amplify the signal OUT to the level of the power supply voltage VDD, and amplify the complementary signal OUTB to the level of the ground voltage VSS. Furthermore, when the signal of the transmission line 201 has a lower voltage than the reference voltage VREF, the differential amplifier 222 may amplify the signal OUT to the level of the ground voltage VSS, and amplify the complementary signal OUTB to the level of the power supply voltage VDD.

Through the amplification operation of the differential amplifier 222, the signals OUT and OUTB may full swing from the ground voltage VSS to the power supply voltage VDD, unlike the signal of the transmission line 201.

Figure 7:
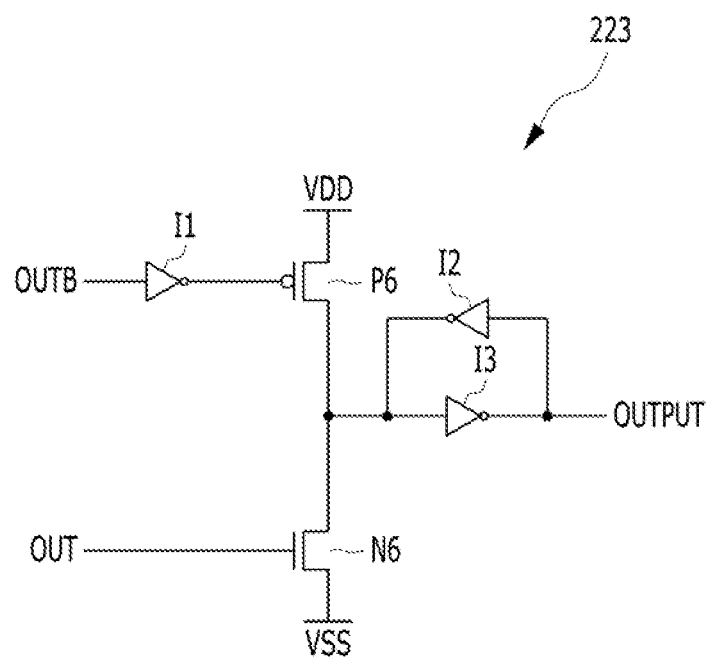
FIG. 7 is a detailed diagram of a latch 223 illustrated in FIG. 2.

FIG. 7 is a detailed diagram of the latch 223 illustrated in FIG. 2.

Referring to FIG. 7, the latch 223 may include inverters I1 to I3, a PMOS transistor P6, and an NMOS transistor N6.

When the signal OUT has a logic high level and the complementary signal OUTB has a logic low level, the NMOS transistor N6 may be turned on, and the inverters I2 and I3 may latch the output signal OUTPUT at a logic high level. Furthermore, when the signal OUT has a logic low level and the complementary signal OUTB has a logic high level, the PMOS transistor P6 may be turned on, and the inverters I2 and I3, forming an inverter latch, may latch the output signal OUTPUT at a logic low level.

In accordance with the embodiments of the present invention, the transmitting/receiving system may reduce power consumption. Furthermore, the transmitting/receiving system may increase resistance to noise and be resistant to PVT variations.

Although various embodiments have been described for illustrative purposes, it will be apparent to those skilled in the art that various changes and modifications may be made without departing from the spirit and scope of the invention as defined in the following claims.

What is claimed is:

1. A transmitting/receiving system comprising a transmitting circuit and a receiving circuit,
    wherein the transmitting circuit, which is suitable for receiving an input signal and transmitting the input signal as a transmission signal having a reduced swing amplitude through a transmission comprises:
        a pull-up element suitable for pull-up driving the first node in response to the input signal;
        a pull-down element suitable for pull-down driving second node in response to the transmission signal; and
        a voltage tailor coupled between the first and second nodes, and
    wherein the receiving circuit comprises:
        a reference voltage generator having a replica circuit of the transmitting circuit to generate a reference voltage; and
        a differential amplifier suitable for differentially amplifying the reference voltage and the transmission signal received from the transmission line.

2. The transmitting/receiving system of claim 1, wherein the reference voltage generator comprises:
    a replica pull-up element suitable for pull-up driving a third node;
    a replica pull-down element suitable for pull-down driving a fourth node; and
    a replica voltage tailor coupled between the third node and the fourth node.

3. The transmitting/receiving system of claim 2, wherein the replica pull-up element and the replica pull-down element are turned on when the receiving circuit is enabled.

4. The transmitting/receiving system of claim 3, wherein the reference voltage generator further comprises a precharge pull-up element for pull-up driving the third node when the receiving circuit is disabled.

5. The transmitting/receiving system of claim 2, wherein the transmission line is coupled to the first node.

6. The transmitting/receiving system of claim 5, wherein each of the voltage tailor and the replica voltage tailor comprises a resistor and one or more diodes which are coupled in series.

7. The transmitting/receiving system of claim 6, wherein the reference voltage is generated from one node among the third node and nodes included in the replica voltage tailor.

8. The transmitting/receiving system of claim 1, wherein the receiving circuit further comprises a latch suitable for latching amplification results of the differential amplifier.

9. A transmitting/receiving system comprising a transmitting circuit and a receiving circuit,
    wherein the transmitting circuit, which is suitable for receiving an input signal to transmit the input signal as a transmission signal to having a reduced swing amplitude through a transmission line, comprises:
        a PMOS transistor suitable for pull-up driving a first node in response to the input signal;
        an NMOS transistor suitable for pull-down driving a second node in response to the transmission signal; and
        one or more resistors and one or more diodes which are coupled in series between the first and second nodes, and
    wherein the receiving circuit comprises:
        a reference voltage generator having a replica circuit of the transmitting circuit to generate a reference voltage; and
        a differential amplifier suitable for differentially amplifying the reference voltage and the transmission signal received from the transmission line.

10. The transmitting/receiving system of claim 9, wherein the reference voltage generator comprises:
    a replica PMOS transistor suitable for maintaining a turn-on state when the receiving circuit is enabled, and pull-up driving a third node;
    a replica NMOS transistor suitable for maintaining a turn-on state when the receiving circuit is enabled, and pull-down driving a fourth node; and
    one or more replica resistors and one or more replica diodes which are coupled in series between the third and fourth nodes, and
    the reference voltage is generated from one node among the third node and nodes between the one or more replica resistors and the one or more replica diodes.

11. The transmitting/receiving system of claim 10, wherein the reference voltage generator further comprises a precharge PMOS transistor suitable for pull-up driving the third node when the receiving circuit is disabled.

12. The transmitting/receiving system of claim 9, wherein the receiving circuit further comprises a latch suitable for latching amplification results of the differential amplifier.

13. A transmitting/receiving system comprising:
a transmission line;
a transmitting circuit suitable for receiving an input signal to transmit the input signal as a transmission signal having a reduced swing amplitude through the transmission line; and
a receiving circuit suitable for receiving the transmission signal from the transmission line,
wherein the receiving circuit includes:
a reference voltage generator having a replica circuit of the transmitting circuit to generate a reference voltage; and
a differential amplifier suitable for differentially amplifying the reference voltage and the transmission signal having the reduced swing amplitude, received from the transmission line.

14. The transmitting receiving system of claim 13, wherein the receiving circuit further includes a latch suitable for latching amplification results of the differential amplifier.

* * * * *